United States Patent [19]
Fromm et al.

[11] Patent Number: 4,951,246
[45] Date of Patent: Aug. 21, 1990

[54] NIBBLE-MODE DRAM SOLID STATE STORAGE DEVICE

[75] Inventors: Eric C. Fromm, Eau Claire; Lonnie R. Heidtke, Chippewa Falls, both of Wis.

[73] Assignee: Cray Research, Inc., Minneapolis, Minn.

[21] Appl. No.: 391,229

[22] Filed: Aug. 8, 1989

[51] Int. Cl.⁵ ............................................. G06F 12/00
[52] U.S. Cl. ..................... 364/900; 364/964.9; 364/959.1; 364/948.3; 364/948.31
[58] Field of Search ... 364/200 MS File, 900 MS File; 365/239, 233, 189, 230, 230.03

[56] References Cited

U.S. PATENT DOCUMENTS

| | | | |
|---|---|---|---|
| 4,051,551 | 9/1977 | Lawrie et al. | 364/200 |
| 4,112,489 | 9/1978 | Wood | 364/200 |
| 4,149,242 | 4/1979 | Pirz | 364/200 |
| 4,187,539 | 2/1980 | Eaton | 364/200 |
| 4,280,176 | 7/1981 | Tan | 364/200 |
| 4,293,941 | 10/1981 | Muraoka et al. | 364/200 |
| 4,435,792 | 3/1984 | Bechtolsheim | 365/230 |
| 4,442,503 | 4/1984 | Schütt et al. | 364/900 |
| 4,489,381 | 12/1984 | Lavallee et al. | 364/200 |
| 4,630,230 | 12/1986 | Sundet | 364/900 |
| 4,792,929 | 12/1988 | Olson et al. | 365/233 |
| 4,796,232 | 1/1989 | House | 365/189 |
| 4,800,530 | 1/1989 | Itoh et al. | 365/189 |
| 4,803,621 | 2/1989 | Kelly | 364/200 |
| 4,809,234 | 2/1989 | Kuwashiro | 365/230 |
| 4,811,305 | 3/1989 | Watanabe et al. | 365/239 |
| 4,901,230 | 2/1990 | Chen et al. | 364/200 |

*Primary Examiner*—Raulfe B. Zache

[57] ABSTRACT

A nibble-mode DRAM solid state storage device is organized into a plurality of sections each including a plurality of groups, each including a plurality of ranks of DRAM memory chips. A pipeline data path is provided into and out of each group and nibble-mode access is facilitated by simultaneous pipelining of data into and out of the memory while memory reference operations are accomplished.

1 Claim, 2 Drawing Sheets

NIBBLE-MODE DRAM SOLID STATE STORAGE DEVICE

Background of the Invention

The present invention pertains to the field of solid state storage devices, and more particularly to the field of add-on high speed solid state storage devices.

Technical Field of the Invention

In recent years advancements in integrated circuit technology have enabled development of memory chips of greatly increased capacity, reducing the cost per unit storage for solid state storage devices. Pursuant to both the cost reductions and the greatly reduced space requirements, solid state storage devices have become increasingly popular as an alternative or supplement to magnetic storage devices such as tapes or disk drives, particularly in I/O bound processing systems.

U.S. Pat. No. 4,630,230, issued Dec.16, 1986, describes a solid state storage device utilizing an organization which minimizes data fan in and fan out and addressing fan out requirements. The storage section is organized into two groups, each group including a plurality of sections. Each section provided includes eight banks, paired in modules. The addressing and data is provided to the two groups identically so that each group receives one word each clock cycle. A pipeline technique of data distribution is employed, wherein data words are supplied to a first section in each group and transferred section to section on each succeeding clock cycle until all sections have a word and may be written into storage simultaneously. In the case of a write operation, words are captured from the sections simultaneously and passed out of the memory section to section. Refresh operations are accomplished on a periodic basis and a plurality of power supplies are provided for the storage modules in order to distribute refresh current demand over time and between the power supplies, providing for a safe and speedy refresh operation.

Summary of the Invention

The present invention provides a nibble-mode DRAM solid state storage device utilizing the general concept of pipelining as described in U.S. Patent No. 4,630,230.The invention provides for organizing the memory into sections, with each section including a plurality of groups. Each group is organized into a plurality of ranks, with each rank including a pair of banks. Each group includes addressing circuitry shared between the two banks, each of which may be independently controlled, one at a time. Nibble-mode DRAM is deployed in each bank, and the addressing circuitry is adapted to address the DRAM in Nibble-mode cycles.

A plurality of ports into the solid state storage device are provided, with each port having an independent data path to each section of the memory. Each section includes steering logic to direct data flow from a path into the group being accessed. An assembly register is provided for the group of ranks in a group, and includes a plurality of segments with data storage locations, with one segment for each rank. The assembly register is configured to receive data words in a pipeline fashion, which are in turn transferred from the assembly register into a write data register, which includes a plurality of locations corresponding to the locations in the assembly register. The data words are transferred from the write register into the memory under the control of the addressing circuitry. In a read operation, the ranks are accessed to simultaneously produce a plurality of data words, which are loaded in parallel into a read data register which is configured to pipeline the data to a data path out to a port.

Brief Description of the Drawinqs

FIG. 1 is a Block diagram of the overall organization of SSD of the present invention; and FIG. 2 a block diagram of the organization of a memory group according to the present invention.

Detailed Description of the Invention

The solid state storage device of the present invention is implemented using 1 or 4 Megabit by 1 bit DRAM memory components. These components are accessed using a Nibble-mode reference cycle which causes four bits of data to be read or written in a single access to a chip as a serial bit stream. This mode of access provides a significant improvement in DRAM access bandwidth (measured in bits per second) over normal single bit access cycles.

Figure 1:
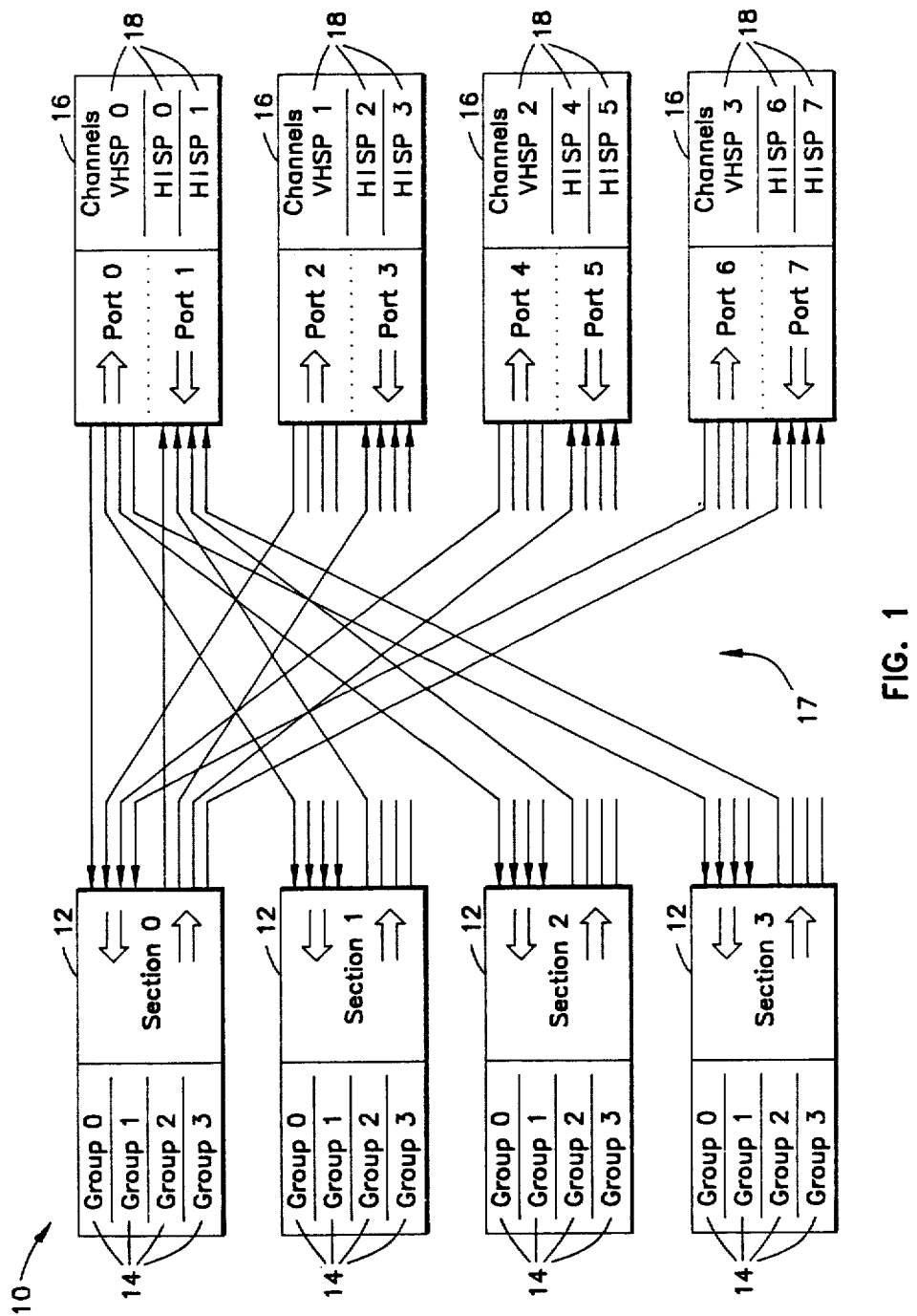

As seen with reference to FIG. 1, the SSD 10 of the present invention is organized into sections 12 and groups 14 within the sections, from which 64 72-bit words are read or written in a single reference cycle. There are four groups 14 in each section 12. SSD 10 may be configured with 1, 2 or 4 sections. Each 72-bit word consists of 64 bits of data plus an 8-bit 'SECDED' (single error correcting, double error detecting) checkbyte.

Figure 2:
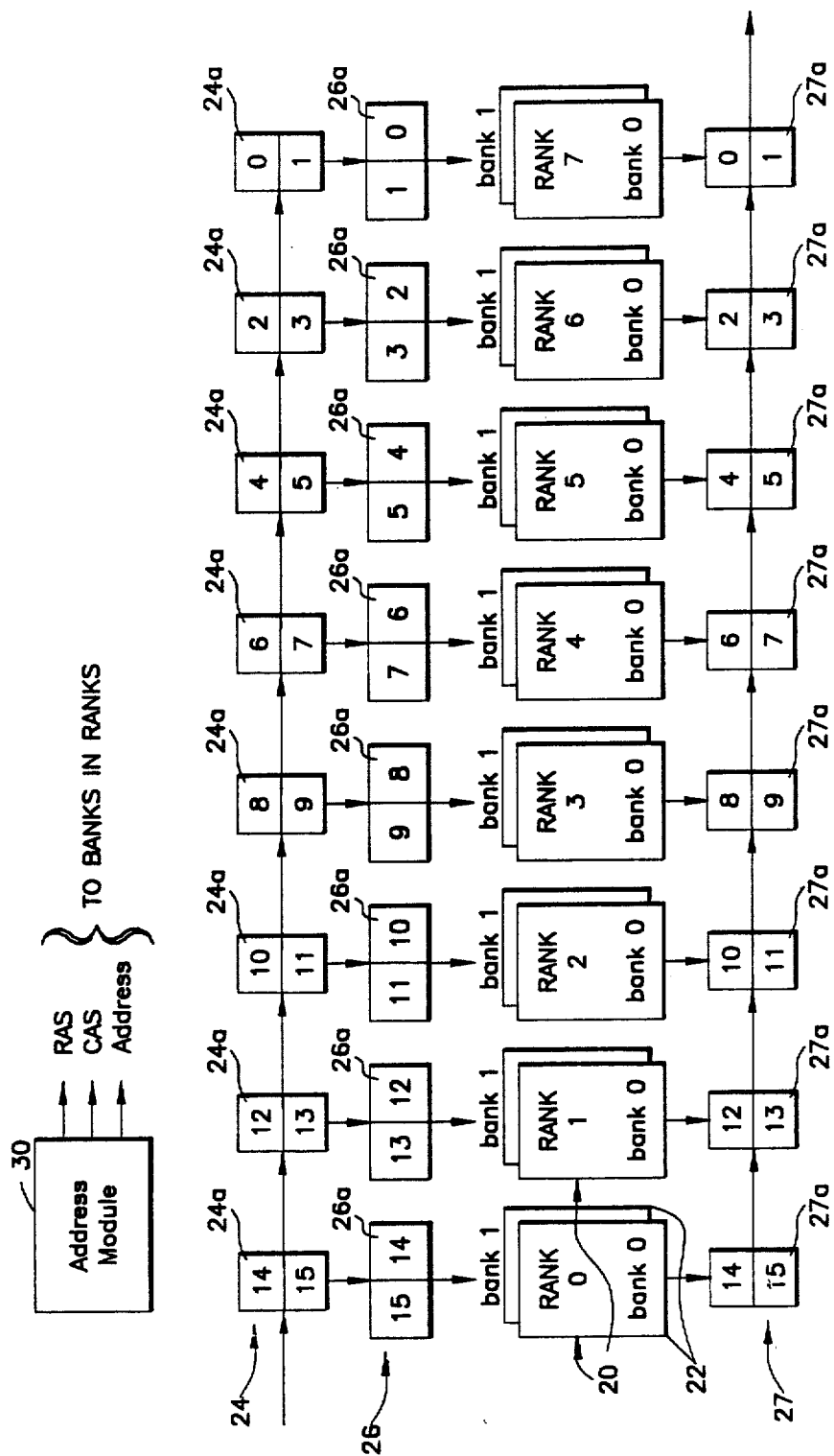

As seen in FIG. 2, each group 14 is organized as a set of eight 144-bit ,Ranks, 20. Each Rank 20 is 2 banks deep. Each bank 22 is connected to a memory address control circuit 30 which is shared between the two banks and can operate each bank independently (one at a time). When a Group is accessed, either Bank 0 or Bank 1 of all 8 Ranks is active.

Each Bank 22 is constructed using 144 DRAM chips to form two 72-bit words. Therefore, each Rank in a (4bit) nibble-mode access will thus read or write a total of 8 72-bit words. One bank of all 8 Ranks in a Group, which as noted above share the same memory addressing circuitry 30, are accessed simultaneously with the same address, so that a total of 64 words is read or written in a Group in one reference cycle. Further information on addressing DRAM is disclosed in U.S. Pat. No. 4,630,230,the disclosure of which with respect thereto is hereby incorporated by reference herein.

Each of sections 12 includes data steering logic whereby data may be directed from a path 17 into any one of the Groups within the section, and correspondingly out of any one of the Groups to any one of the paths.

A Group write cycle proceeds in the following fashion:

A full 64-word block of data is assembled for writing to SSD 10 in a port module 16. This data can be delivered to the ports via channels 18 connected to an input-/output processor or a central processing unit. A variety of I/O channels and channel types can be provided, e.g., a very high speed channel (VHSP) or high speed channel (HSP) into the ports. Once a block of data is assembled, a write reference to the destination Group is initiated by asserting the appropriate DRAM control timing signals from circuitry 30 to either Bank 0 or 1 within that Group. Addressing circuitry 30 presents a base address to the DRAMS which is used as the starting location for the 4 bit nibble.

At the same time, write data is sent from the originating port 16 over a two-word wide (144 bit) path 17 and arrives at the Group at a rate of two words per clock period. As each 144-bit double word arrives at the Group it is shifted into a 144-bit wide by 8 (Rank) deep assembly register 24 having a plurality of segments 24a, each connected in a parallel pipeline fashion. When 8 doublewords (one for each of the eight Ranks) have been shifted in (two words in each location of shift register segment 24a, i.e. words 0, 1; 2, 3; 4, 5; etc.), the words are transferred in parallel into a write Data Register 26 in the corresponding locations 26a and thereby presented to the DRAMS in the Ranks and held stable for the next 8 clock periods while the DRAM CAS (Column Address Strobe) is cycled to effect the write operation. The first write operation corresponds to the first bit in the 4-bit nibblemode write cycle.

At the same time that the first 8 double-words are being written into the Group DRAMS, a second 8 double-words is being loaded into shift register 24. At the end of the initial 8 clock period write operation, the second set of 8 double-words will have been assembled and will then be parallel loaded into the write Data Register 26 for a second write operation. This is the second bit of the nibble-mode cycle.

This same sequence is repeated twice more to complete a 4-bit nibble-mode write cycle and thus the 64-word Group write operation.

A Group read cycle proceeds in the following fashion:

A read reference to the Group is initiated by asserting the appropriate DRAM control timing signals to either Bank 0 or 1 within that Group.

Some time later, after the DRAM CAS signal is cycled to affect the read operation, the first bit of the nibble-mode read data will become stable at the DRAM chip outputs of all 8 DRAM Ranks. At that point, the 144-bit double-word from each of the Ranks is simultaneously loaded in parallel into the read Data Register 27, in the corresponding locations of segments 27a (connected together in a pipeline fashion), and in the next 8 clock periods which follow, this data will be shifted out of the Group over a path 17 to a port 16 at the rate of two words every clock period. Each segment 27a includes multiplexing circuitry such that each can choose either to accept data from its corresponding rank or from the previous segment in the pipeline. Thus, segments 27a load data from the ranks at once in parallel and then operate to pass data one to the other in a pipeline fashion to shift the read data to the section steering logic, which passes it over a path 17 to a port 16.

At the end of that 8 clock period sequence second bit in the DRAM nibble cycle will be stable and will thus be loaded into the read Data Register for transmission out of the Group in the 8 ensuing clock periods.

This same sequence is repeated twice more to complete the 64-word Group read operation.

The configuration described above thus provides that each bank of each rank can store 144 Megabits using 1 Megabit DRAMS or 576 Megabits if 4 Megabit are utilized.

The present invention as described above thus provides a solid state storage device utilizing nibble-mode DRAM wherein the high bandwidth operational advantages of pipeline data transfer and nibble-mode DRAM operation can be obtained. The pipeline data path construction allows data path wiring to be minimized, thereby simplifying wiring requirements for the device.

Although the invention has been described herein in its performed form, those of skill in the art will recognize that many modifications and changes may be made thereto without departing from the spirit and scope of the invention as set forth in the appended claims.

What is claimed:

1. A nibble-mode solid state storage device, comprising:

a system clock;

one or more memory sections;

a plurality of memory groups within each said section;

port means for each said section, said port means for carrying parallel read and write data words out of and into said memory groups within each section;

a plurality of memory ranks within each said group;

each said rank including at least one nibble-mode DRAM bank, each siad DRAM bank including a plurality of DRAM semiconductors each including storage cells and responsive to a column address strobe signal to retrieve and store data in said cells;

and assembly register for each said plurality of ranks, said register having a segment corresponding to each of said ranks, said segments connected to form a data pipeline into said group, each said segment providing at least one storage location for a word of data, said assembly register connected to receive data words from said port means;

a write data register connected to said assembly register including a segment corresponding to each of said ranks, each said segment providing a storage location corresponding to a storage location in said assembly register;

means for connecting said write data register to said DRAM banks in said ranks;

a read data register for each said plurality of ranks, said read data register including a data storage segment corresponding to each of said ranks, each said segment providing at least one data storage location for a word of data, said segments connected to form a data pipeline out of said group, said segments including a parallel load input to receive read data words from said banks, a serial load input to receive read data words from a prior segment in the pipeline and a serial output to output read data words to the next segment in the pipeline;

means for connecting said segments of said read data register to receive data at said parallel load input from said DRAM banks in said ranks and to convey a serial stream of read data words to said port means; and control and memory address means for controlling the transfer of data into said groups to be stored in said DRAM banks in a write cycle, and the transfer of data from said DRAM banks out of said groups in a read cycle, (a) said control means active in said write cycle (i) to pipeline load said assembly register with a set of write data words received from said port means, said write data words loaded in synchrony with said system clock, (ii) to transfer said set from said assembly register to said write data register in parallel, (iii) to cycle said column address strobe signal after said set is loaded in said write data register so that said set is transferred to said storage cells in said DRAM banks, and (iv) to pipeline load said assembly register with another set of write data words while the words in said write data register are transferred to and stored in the DRAM banks, and (b) said control means active in a read cycle (i) to cycle said column address signal to retrieve a set of read data words from the storage cells of said DRAM banks, (ii) to parallel load said read data register from said banks with a set of read data words, said parallel load occurring through said parallel load input, (iii) to unload said set from said read data register in a pipeline fashion so that read data words are output to said port means in a serial stream, the read data words in said set being pipeline transferred from said serial data outputs to corresponding serial data inputs in synchrony with sad system clock, and (iv) to cycle said column address strobe signal again so that another set of words are retrieved from said storage cells while said read data words are pipeline unloaded from said read data register.

* * * * *

UNITED STATES PATENT AND TRADEMARK OFFICE
CERTIFICATE OF CORRECTION

PATENT NO. : 4,951,246

DATED : August 21, 1990

INVENTOR(S) : Fromm, et al.

It is certified that error appears in the above-identified patent and that said Letters Patent is hereby corrected as shown below:

Col. 2, line 34, change "144-bit,Ranks," to --144-bit 'Ranks'--

Col. 3, line 2, delete "4 bit" and insert --4-bit--

Col. 3, line 19, change "nibblemode" to --nibble-mode--

Col. 3, line 40 change "double-word" to --double-words--

Col. 3, line 40 change "is" to --are--

Col. 3, line 54 change "sequence second" to --sequence the second--

Col. 3, line 66 change "DRAM" to --DRAMS--

Col. 4, line 5 change "performed" to --preferred--

Col. 4, line 21 change "siad" to --said--

Col. 4, line 25 change "and" to --an--

Col. 6, line 6 change "sad" to --said--

Signed and Sealed this

Twenty-first Day of April, 1992

Attest:

HARRY F. MANBECK, JR.

*Attesting Officer*     *Commissioner of Patents and Trademarks*